United States Patent
Chen et al.

(10) Patent No.: US 9,831,215 B1
(45) Date of Patent: Nov. 28, 2017

(54) SEMICONDUCTOR PACKAGE AND FORMING METHOD THEREOF

(71) Applicant: TAIWAN SEMICONDUCTOR MANUFACTURING CO., LTD., Hsinchu (TW)

(72) Inventors: Hsien-Wei Chen, Hsinchu (TW); Li-Hsien Huang, Hsinchu County (TW); An-Jhih Su, Taoyuan (TW); Wei-Yu Chen, New Taipei (TW); Ying-Ju Chen, Yunlin County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/227,865

(22) Filed: Aug. 3, 2016

(51) Int. Cl.
  *H01L 25/065* (2006.01)
  *H01L 25/00* (2006.01)
  *H01L 23/00* (2006.01)

(52) U.S. Cl.
  CPC ........ *H01L 25/0657* (2013.01); *H01L 23/562* (2013.01); *H01L 25/50* (2013.01); *H01L 2225/06524* (2013.01); *H01L 2225/06548* (2013.01); *H01L 2225/06568* (2013.01); *H01L 2225/06582* (2013.01)

(58) Field of Classification Search
  CPC .... H01L 25/0657; H01L 25/50; H01L 23/562
  See application file for complete search history.

(56) References Cited

U.S. PATENT DOCUMENTS

| | | | | |
|---|---|---|---|---|
| 7,132,734 B2* | 11/2006 | Johnson | .............. | H01L 23/4951 257/666 |
| 8,941,222 B2* | 1/2015 | Hunt | ..................... | H01L 21/565 257/678 |

* cited by examiner

*Primary Examiner* — William Coleman
(74) *Attorney, Agent, or Firm* — Maschoff Brennan

(57) ABSTRACT

A semiconductor package includes at least one first semiconductor device, a first molding compound, a dielectric layer, at least one conductive feature and at least one compensating structure. The first molding compound is present on at least one sidewall of the first semiconductor device. The dielectric layer is present on the first molding compound and the first semiconductor device. The conductive feature present is at least partially in the dielectric layer and electrically connected to the first semiconductor device. The compensating structure is present at least partially in the dielectric layer. The compensating structure is monolithically connected to the first molding compound.

20 Claims, 20 Drawing Sheets

SEMICONDUCTOR PACKAGE AND FORMING METHOD THEREOF

BACKGROUND

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications. Thus, packages such as wafer level packaging (WLP) have begun to be developed, in which integrated circuits (ICs) are placed on a carrier having wiring for making connection to the ICs and other electrical components. In a wafer level packaging process, dies are attached onto a carrier, and a molding compound is formed over the dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
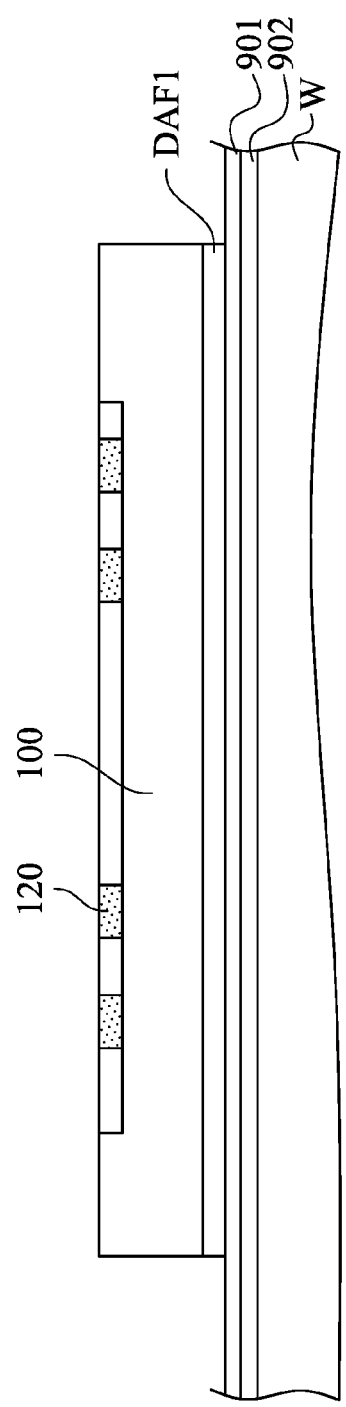
FIGS. 1-18 illustrate a method of forming a semiconductor package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1-18 illustrate a method of forming a semiconductor package in accordance with some embodiments of the present disclosure. In FIG. 1, an adhesive layer 902 is present on a carrier wafer W. In some embodiments, the carrier wafer W may be a blank glass carrier, a blank ceramic carrier, or the like. In some other embodiments, the carrier wafer W may include silicon (Si), germanium (Ge), glass, III-V compound or other materials. The adhesive layer 902 may be formed of an adhesive such as a Ultra-Violet (UV) glue, Light-to-Heat Conversion (LTHC) glue, or the like, although other types of adhesives may be used. A buffer layer 901 is formed over the adhesive layer 902. The buffer layer 901 is a dielectric layer, which may be a polymer layer comprising a polymer. The polymer may be, for example, polyimide, PolyBenzOxazole (PBO), BenzoCycloButene (BCB), Ajinomoto Buildup Film (ABF), Solder Resist film (SR), or the like. The buffer layer 901 may be a planar layer having a substantially uniform thickness, in which the thickness thereof may be greater than about 2 and may be between about 2 µm and about 40 Top and bottom surfaces of buffer layer 901 are also substantially planar. At least one first semiconductor device 100 is attached to the buffer layer 901 via a first die attach film (DAF) DAF1. A pick and place apparatus and method may be used to place the first semiconductor device 100 in a predetermined location on the buffer layer 901. In some embodiments, the first semiconductor device 100 may be a die having a conductive layer formed as a contact pad 120 on the top surface of the first semiconductor device 100 using a patterning and deposition process. The first semiconductor device 100 may have a plurality of the contact pads 120. The contact pads 120 may be made of aluminum (Al), copper (Cu), tin (Sn), nickel (Ni), gold (Au), silver (Ag), or other electrically conductive materials. Deposition of the contact pads 120 may use an electrolytic plating or electroless plating process. The size, shape, and location of the contact pads 120 illustrated in FIG. 1 are only for illustration purposes and are not limiting. The contact pads 120 of the first semiconductor device 100 may be of the same size or of different sizes.

Figure 2:
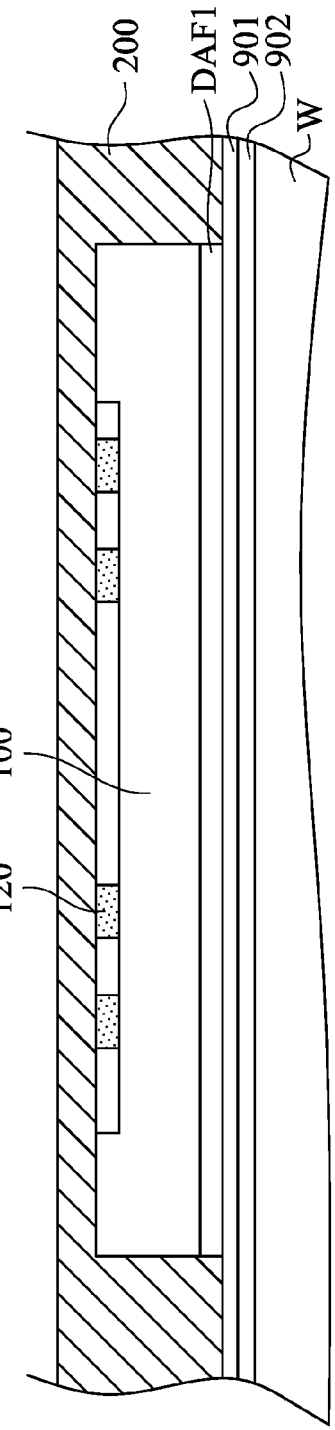

In FIG. 2, the first semiconductor device 100 is overmolded with a first molding compound 200 using a compressing molding process. In some embodiments, the first molding compound 200 may be made of a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the first molding compound 200 may be made of epoxy resin, such as epoxy cresol novolac (ECN), biphenyl epoxy resin, multifunctional liquid epoxy resin, or any combinations thereof. In still other embodiments, the first molding compound 200 may be made of epoxy resin optionally including one or more fillers to provide the composition with any of a variety of desirable properties. Examples of fillers can be aluminum, titanium dioxide, carbon black, calcium carbonate, kaolin clay, mica, silica, talc, wood flour, or any combinations thereof.

Figure 3:
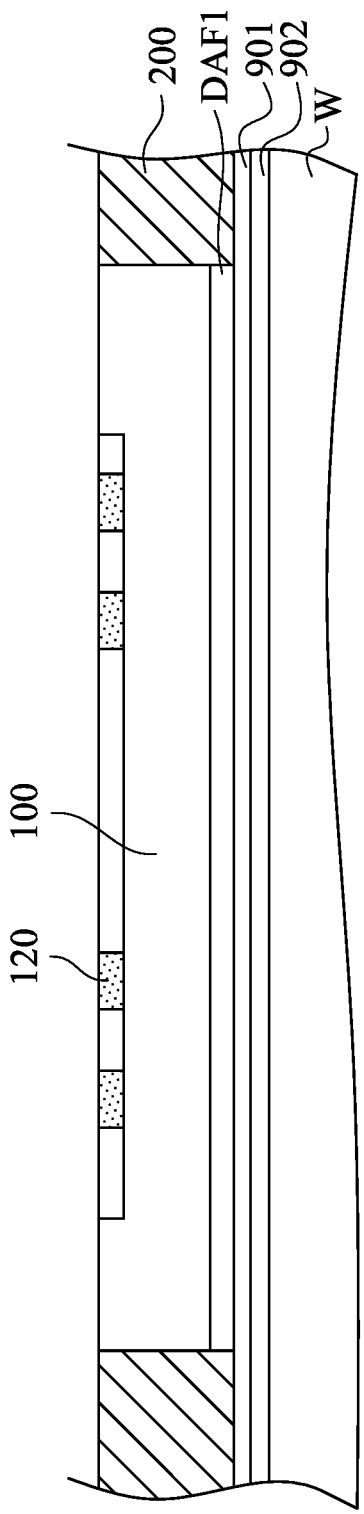
Figure 4:
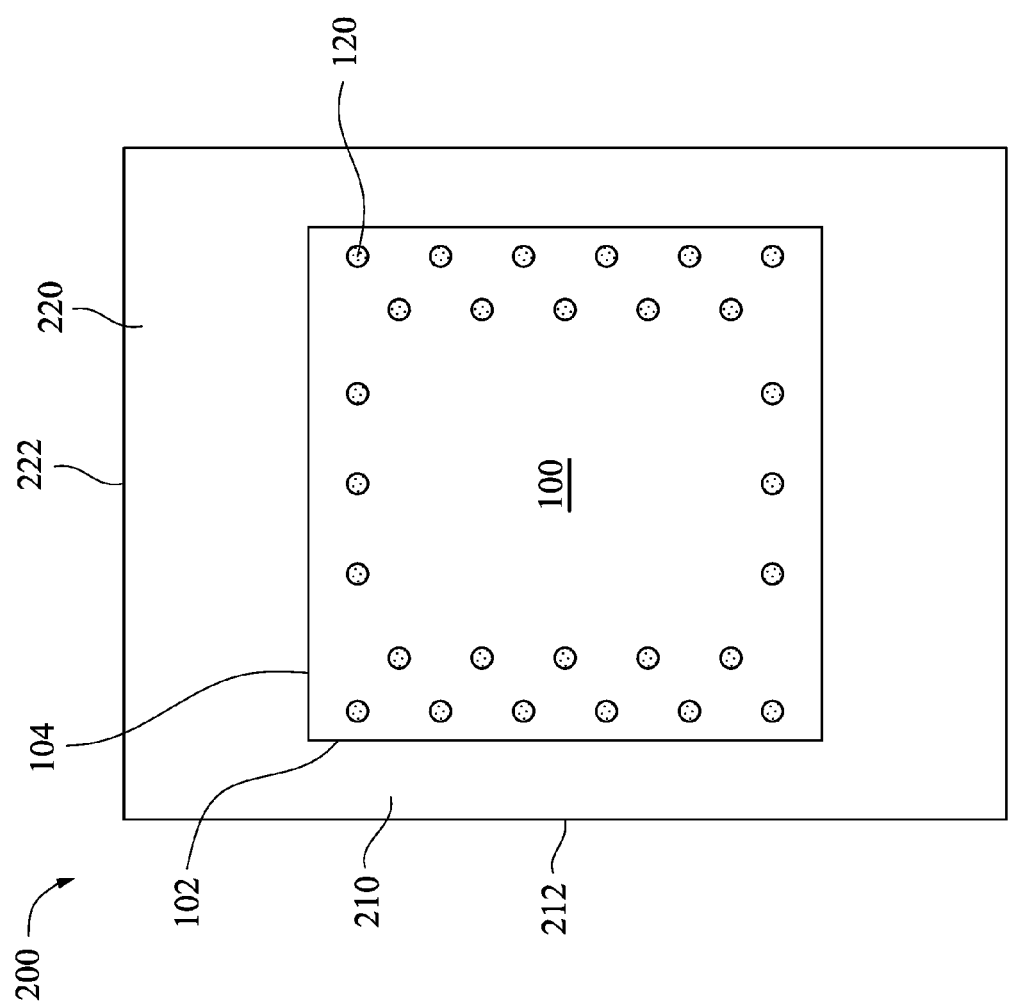

In FIG. 3, a portion of the first molding compound 200 overlying the first semiconductor device 100 is removed so that contact pads 120 on the top side of the first semiconductor device 100 are exposed. Removal of the portion of the first molding compound 200 may be performed by a grinding process or a CMP process. After the removal of the portion of the first molding compound 200 overlying the first semiconductor device 100, the first molding compound 200 is formed on at least one sidewall of the first semiconductor device 100. In some embodiments, the first semiconductor device 100 is encircled by the first molding compound 200. As shown in FIG. 4, which is a top view of the structure shown in FIG. 3, the first semiconductor device 100 has a first sidewall 102 and a second sidewall 104 adjacent to each other, and molding portions of the first molding compound 200 are respectively present on the first sidewall 102 and the second sidewall 104. In some embodiments, the molding portions respectively present on the first and second sidewalls 102 and 104 have unequal widths. For example, the molding portions of the first molding compound 200 include at least one narrow molding portion 210 and at least one wide molding portion 220. The narrow molding portion 210 is present on the first sidewall 102, and the wide molding portion 220 is present on the second sidewall 104. The narrow molding portion 210 is narrower than the wide molding portion 220. In other words, the narrow molding portion 210 and the wide molding portion 220 respectively include peripheries 212 and 222 that are distal to the first semiconductor device 100, and a distance from the periphery 212 of the narrow molding portion 210 to the first sidewall 102 of the first semiconductor device 100 is less than a distance from the periphery 222 of the wide molding portion 220 to the second sidewall 104 of the first semiconductor device 100. As such, the narrow molding portion 210 is narrower than the wide molding portion 220.

Figure 5:
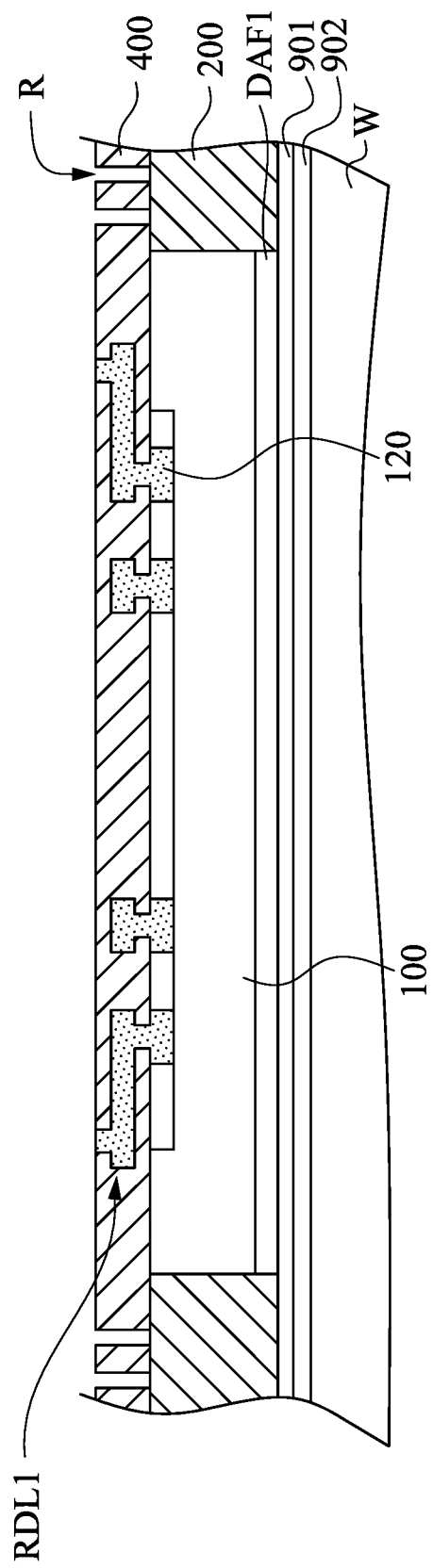

In FIG. 5, at least one first dielectric layer 400 is formed on the first semiconductor device 100 and the first molding compound 200. At least one conductive feature, such as a first redistribution layer RDL1, is formed in the first dielectric layer 400 to be electrically connected to the contact pads 120 of the first semiconductor device 100. In some embodiments, the first dielectric layer 400 and the first molding compound 200 (including the narrow and wide molding portions 210 and 220) are made of different materials. In some embodiments, the first dielectric layer 400 may include at least one dielectric material, such as silicon oxide, silicon nitride, silicon oxynitride, low-k dielectric material, ultra low-k dielectric material, one or more dielectric materials, or any combinations thereof. In some embodiments, the first redistribution layer RDL1 may include via plugs, contact plugs, damascene structures, dual damascene structures, metallic regions, metallic lines, or any combinations thereof. The via plugs, contact plugs, damascene structures, dual damascene structures, metallic regions, and metallic lines may be made of at least one conductive material, such as tungsten, aluminum, copper, titanium, tantalum, titanium nitride, tantalum nitride, nickel silicide, cobalt silicide, other proper conductive materials, or combinations thereof. In some embodiments, there are multiple first dielectric layers 400 and multiple first redistribution layers RDL1. Each first redistribution layer RDL1 can be sandwiched by two of the first dielectric layers 400.

In FIG. 5, at least one recessed feature R is formed in the first dielectric layer 400. In some embodiments, formation of the first redistribution layer RDL1 in the first dielectric layer 400 includes forming at least one hole in the first dielectric layer 400 and then forming a conductive material at least partially in the hole to be the first redistribution layer RDL1. The recessed feature R and the hole may be formed using the same photolithography process. Before forming the conductive material, at least one photoresist layer is formed to cover the recessed feature R, and therefore, the conductive material will not be formed in the recessed feature R. After forming the conductive material, the photoresist layer is removed. In some embodiments, when there are multiple first dielectric layers 400, multiple openings are respectively formed in the first dielectric layers 400 and in communication with each other to form the recessed feature R.

Figure 6:
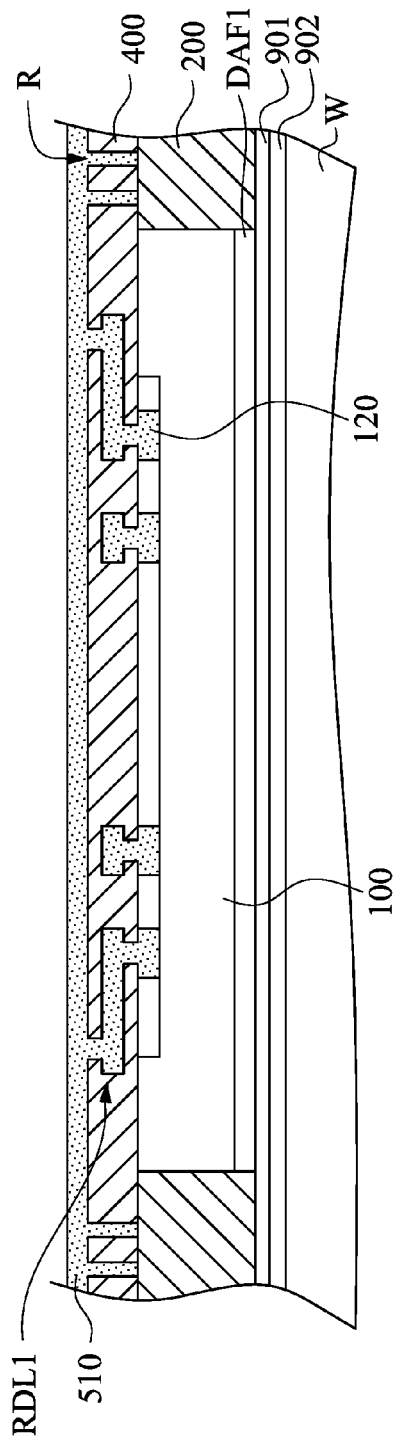

In FIG. 6, a seed layer 510 is formed on the first dielectric layer 400 and in the recessed features R, for example, through physical vapor deposition (PVD) or metal foil laminating. The seed layer 510 may include copper, copper alloy, aluminum, titanium, titanium alloy, or combinations thereof. In some embodiments, the seed layer 510 may include a titanium layer and a copper layer over the titanium layer. In alternative embodiments, the seed layer 510 is a copper layer.

Figure 7:
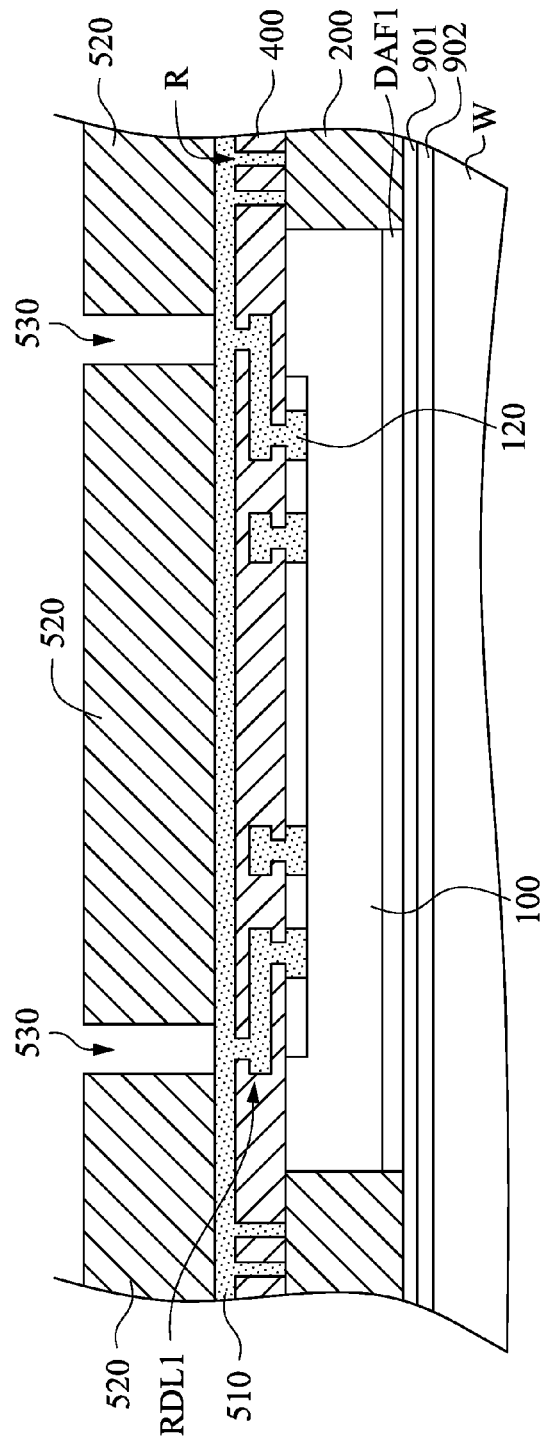

In FIG. 7, a photo resist 520 is applied over the seed layer 510, and is then patterned. As a result, openings 530 are formed in photo resist 520, through which some portions of the seed layer 520 are exposed.

Figure 8:
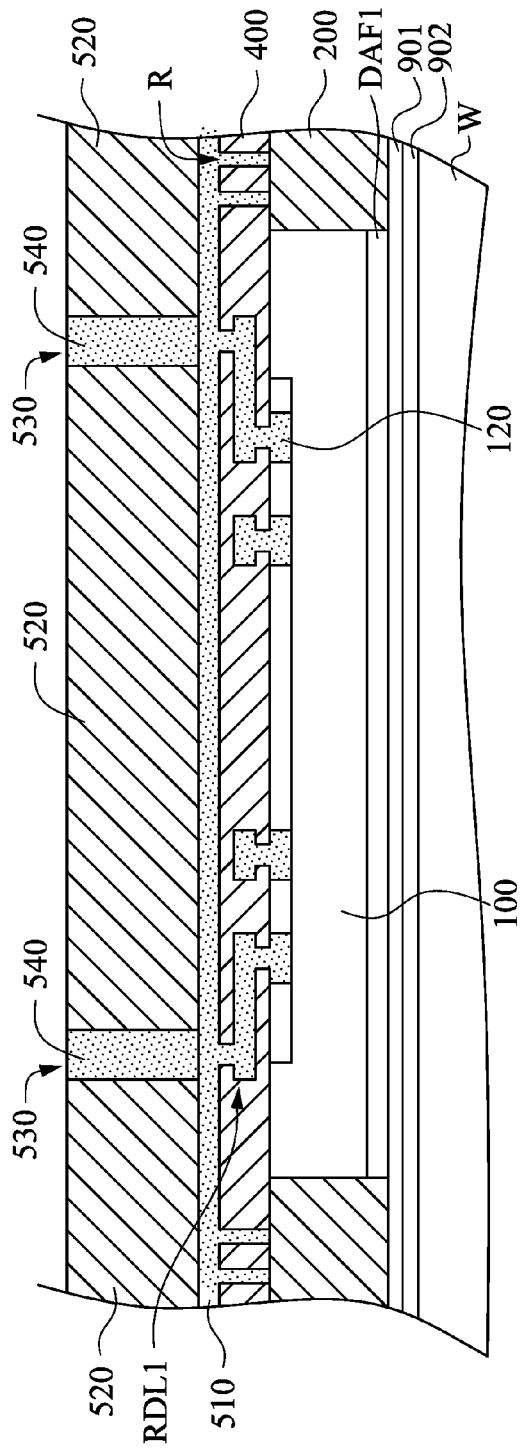
Figure 9:
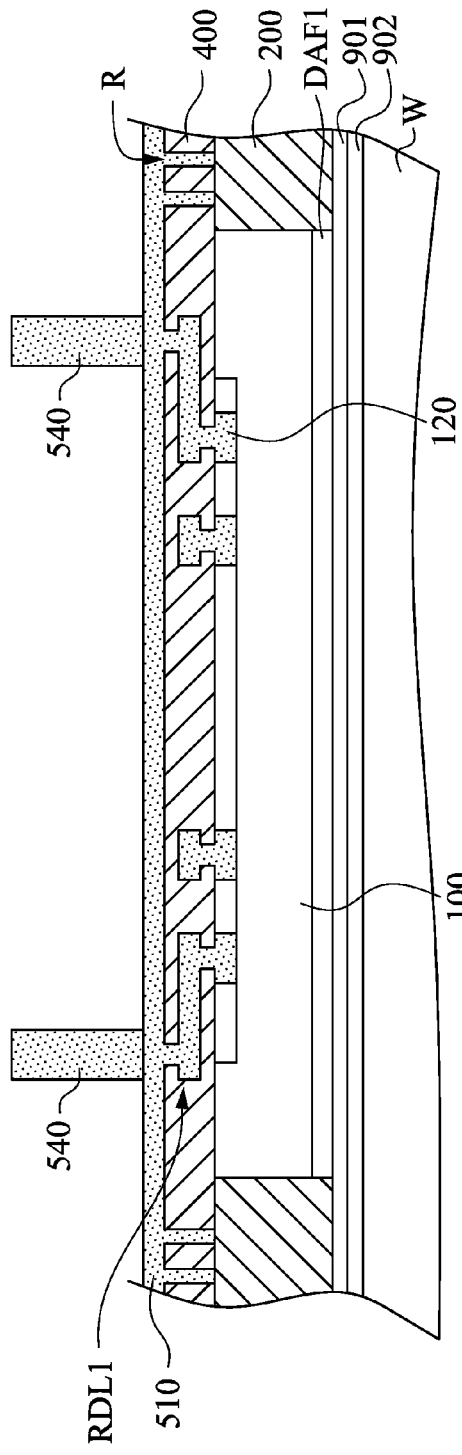

In FIG. 8, conductive features 540 are formed in the openings 530 of the photo resist 520 through plating, which may be electro plating or electro-less plating. The conductive features 540 are plated on the portions of the seed layer 510 that are exposed by the openings 530. The conductive features 540 may include copper, aluminum, tungsten, nickel, solder, or alloys thereof. The top-view shapes of conductive features 540 may be rectangles, squares, circles, or the like. The heights of conductive features 540 are determined by the thickness of the subsequently placed semiconductor device 600 (FIG. 11), with the heights of conductive features 540 greater than the thickness of semiconductor device 600 in some embodiments. After the plating of conductive features 540, the photo resist 520 is removed, and the resulting structure is shown in FIG. 9. After the photo resist 520 is removed, the portions of the seed layer 510 that are previously covered by the photo resist 520 are exposed.

Figure 10:
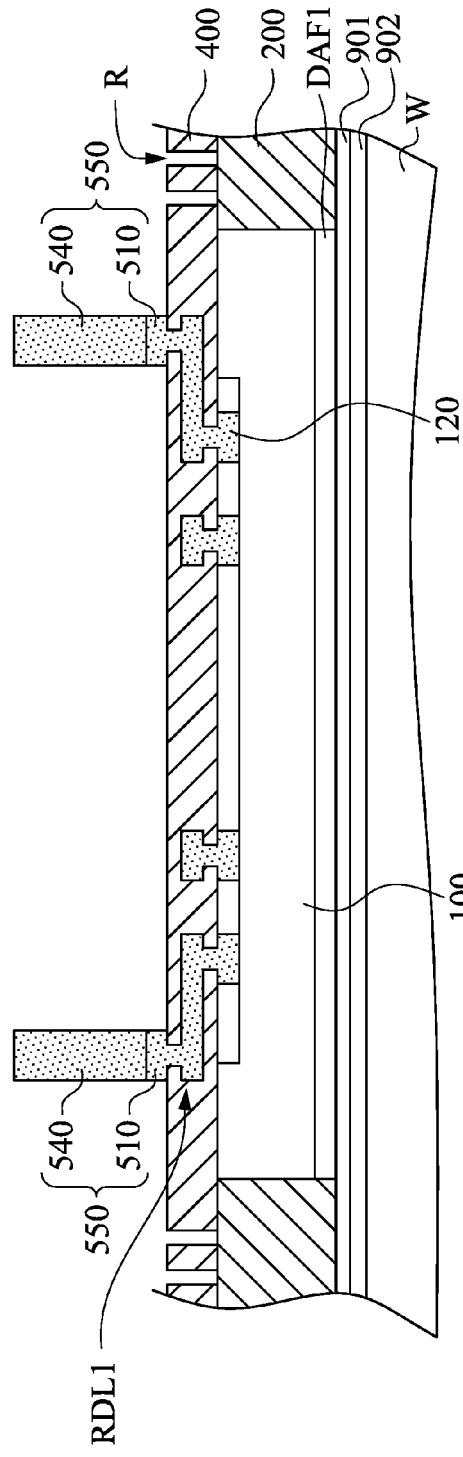
Figure 11:
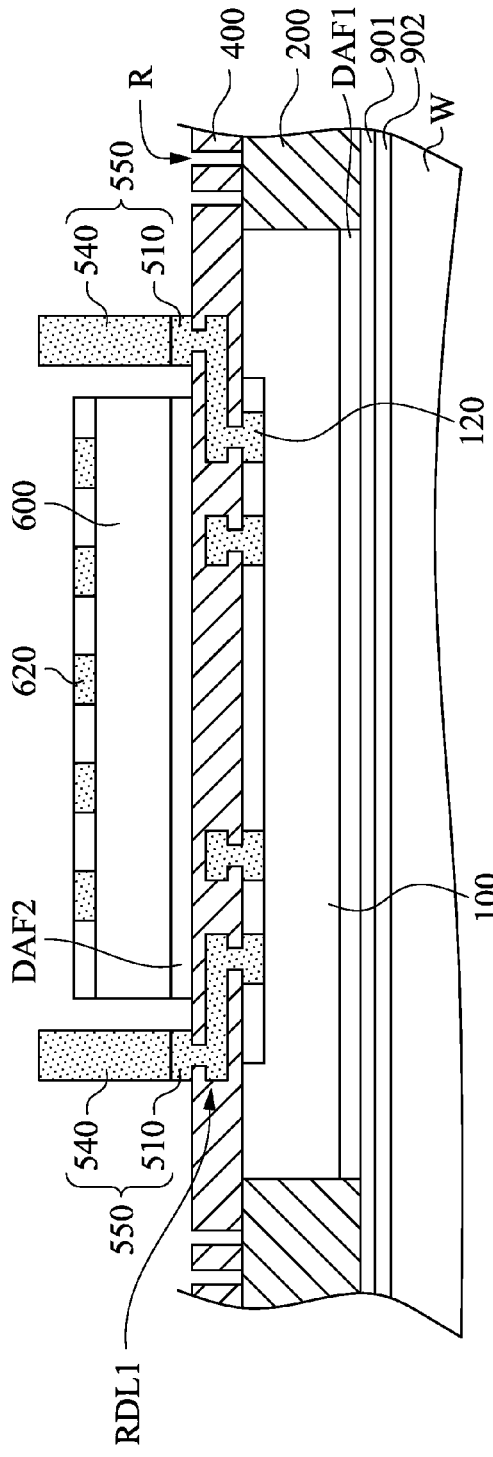
Figure 12:
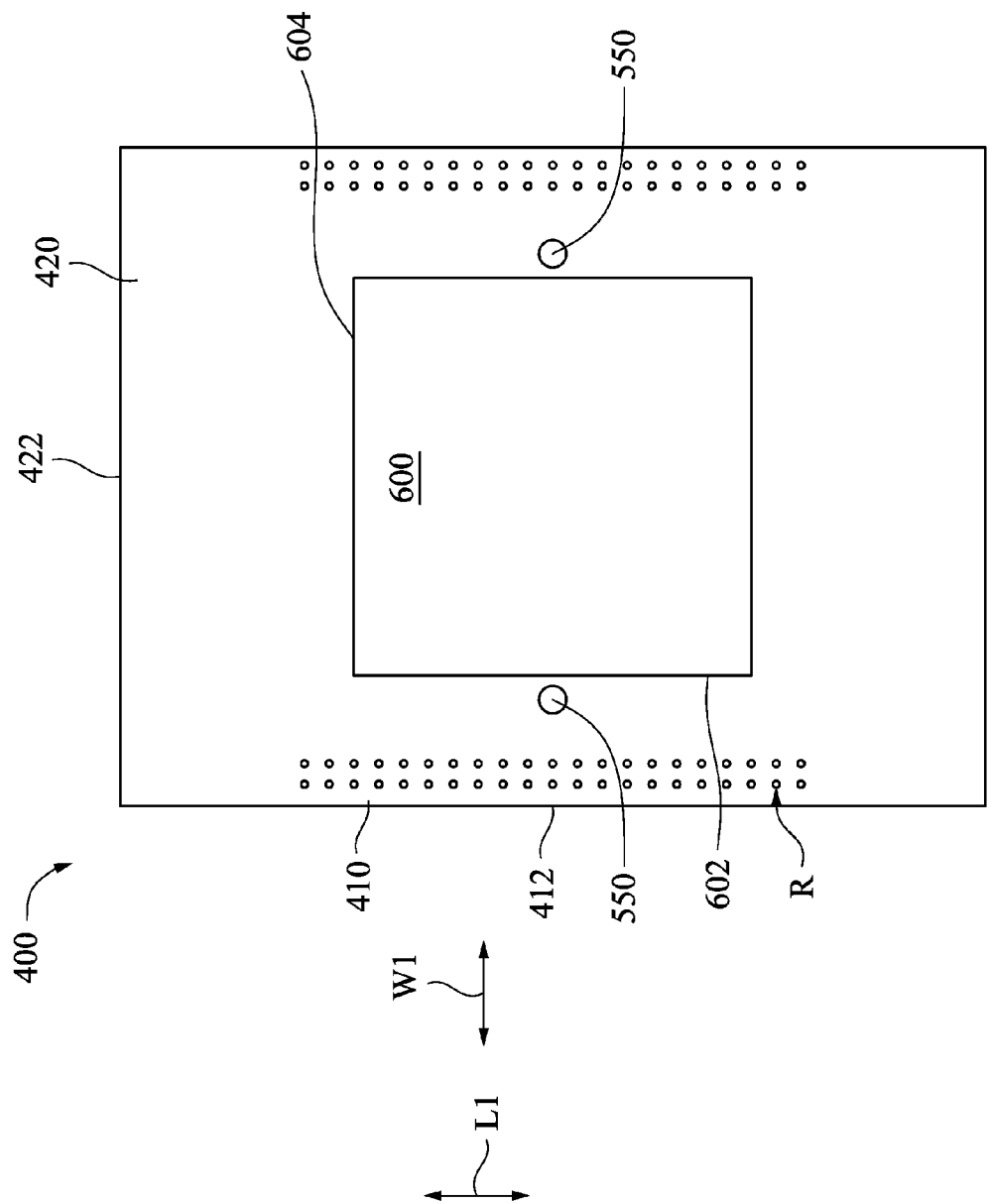

In FIG. 10, an etching process is performed to remove the exposed portions of the seed layer 510, in which the etching of the seed layer 510 may be highly selective relative to the first dielectric layer 400. In other words, portions of the seed layer 510 in the recessed features R can be removed without unacceptably damaging the first dielectric layer 400. The portions of the seed layer 510 that are overlapped by the conductive features 540, on the other hand, remain not etched. Throughout the description, conductive features 540 and the remaining underlying portions of the seed layer 510 are in combination referred to as Through InFO Vias (TIVs) 550. Although the seed layer 510 is shown as a layer separate from conductive features 540, when the seed layer 510 is formed of a material similar to or the same as the respective overlying conductive features 540, the seed layer 510 may be merged with conductive features 540 with no distinguishable interface therebetween. In alternative embodiments, there exist distinguishable interfaces between the seed layer 510 and the overlying metal features 540. In FIG. 11, a second semiconductor device 600 may be attached to the first dielectric layer 400 via a second die attach film DAF2. A pick and place apparatus and method may be used to place the second semiconductor device 600 in a predetermined location on the first dielectric layer 400. In some embodiments, after the placing the second semiconductor device 600, the first dielectric layer 400 may have at least one narrow dielectric portion 410 and at least one wide dielectric portion 420 exposed by the second semiconductor device 600, as shown in FIG. 12, which is a top view of the structure shown in FIG. 11. In other words, the narrow dielectric portion 410 and the wide dielectric portion 420 are not covered by the second semiconductor device 600, and the narrow dielectric portion 410 is narrower than the wide dielectric portion 420. More particularly, the second semiconductor device 600 has a first sidewall 602 and a second sidewall 604 adjacent to each other. The narrow dielectric portion 410 is adjacent to the first sidewall 602, and the wide dielectric portion 420 is adjacent to the second sidewall 604. The narrow dielectric portion 410 and the wide dielectric portion 420 respectively include peripheries 412 and 422 that are distal to the second semiconductor device 600, and a distance from the periphery 412 of the narrow dielectric portion 410 to the first sidewall 602 of the second semiconductor device 600 is less than a distance from the periphery 422 of the wide dielectric portion 420 to the second sidewall 604 of the second semiconductor device 600. As such, the narrow dielectric portion 410 is narrower than the wide dielectric portion 420.

As shown in FIG. 12, the recess feature R is formed in the narrow dielectric portion 410 and is absent on the wide dielectric portion 420. In some embodiments, the recessed feature R is a through hole that is formed through the first dielectric layer 400 and exposes the underlying first molding compound 200, especially the narrow molding portion 210 (See FIG. 4). In some embodiments, a plurality of the recessed features R may be arranged substantially along a lengthwise direction L1 of the narrow dielectric portion 410. In some embodiments, a plurality of the recessed features R may be arranged substantially along a widthwise direction W1 of the narrow dielectric portion 410. In some embodiments, the recessed features R may be arranged in a grid pattern of rows and columns.

In some embodiments, the second semiconductor device 600 may be a die having a conductive layer formed as a contact pad 620 on the top surface of the second semiconductor device 600 using a patterning and deposition process. Second semiconductor device 600 may have a plurality of the contact pads 620. The contact pads 620 may be made with aluminum (Al), copper (Cu), tin (Sn), nickel (Ni), gold (Au), silver (Ag), or other electrically conductive material. The deposition of the contact pads 620 may use an electrolytic plating or electroless plating process. The size, shape, and location of contact pads 620 illustrated in FIG. 11 are only for illustration purposes and are not limiting. The plurality of contact pads 620 of the second semiconductor device 600 may be of the same size or of different sizes.

Figure 13:
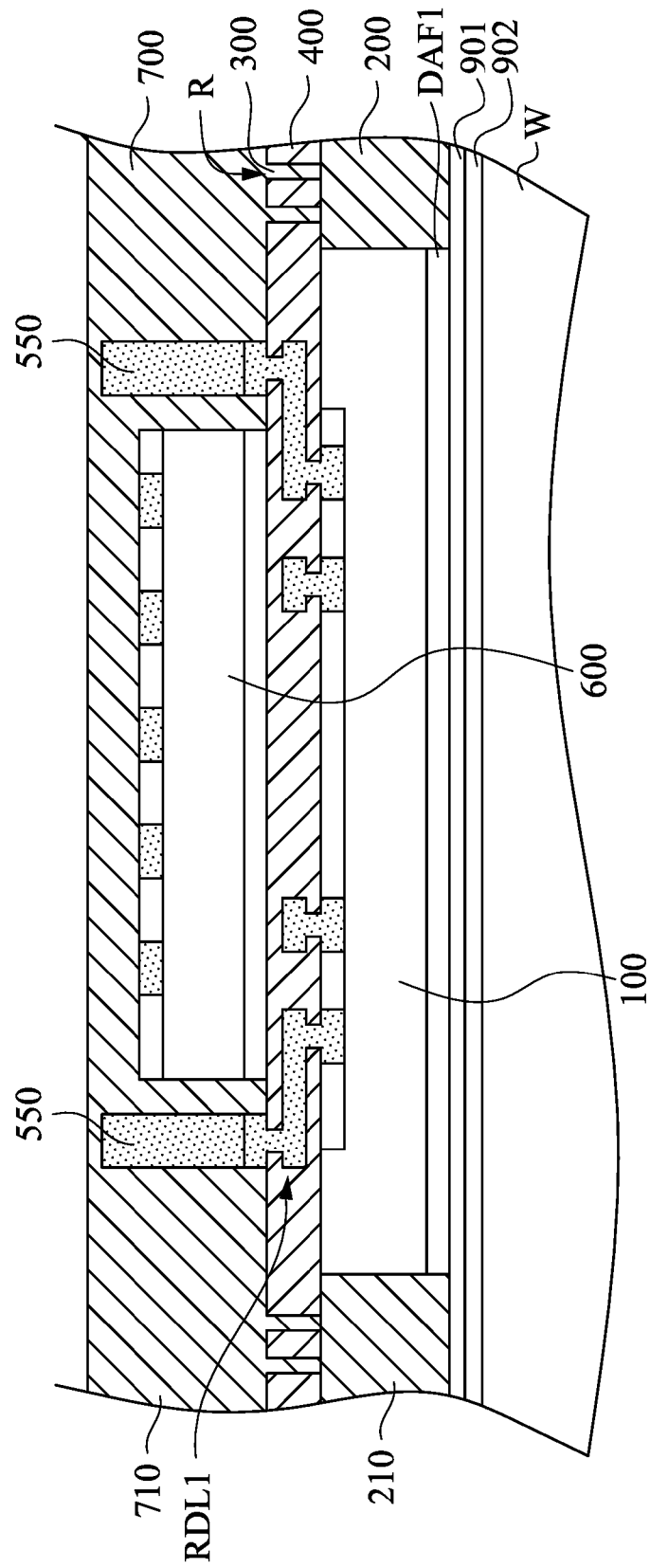

In FIG. 13, the second semiconductor device 600 and TIVs 550 are overmolded with a second molding compound 700 using a compressing molding process. The second molding compound 700 fills gaps between the second semiconductor device 600 and the TIVs 550. By such a molding process, at least a part of the second molding compound 700 is formed in the recessed feature R to serve as a compensating structure 300. In other words, the compensating structure 300 in the first dielectric layer 400 is monolithically connected to the second molding compound 700. Stated differently, the compensating structure 300 and the second molding compound 700 may be integrally formed or one-piece formed.

Reference is made to FIGS. 4 and 13. Volume of the narrow molding portion 210 is less than volume of the wide molding portion 220 because the narrow molding portion 210 is narrower than the wide molding portion 220. Therefore, shrinkage of the narrow molding portion 210 during formation of the first molding compound 200 is less than that of the wide molding portion 220, thereby causing asymmetric warpage to the semiconductor package. In some embodiments, the compensating structure 300 is present on the narrow molding portion 210, and the compensating structure 300 is made of the second molding compound 700. Therefore, during formation of the second molding compound 700, the compensating structure 300 on the narrow molding portion 210 can increase shrinkage in a direction or directions in which the narrow molding portion 210 shrinks, thereby alleviating the asymmetric warpage of the semiconductor package.

In some embodiments, the compensating structure 300 is absent on the wide molding portion 220. In other words, the compensating structure 300 present on the narrow molding portion 210 does not extend to the wide molding portion 220. Therefore, the compensating structure 300 does not increase shrinkage in a direction or directions in which the wide molding portion 220 shrinks, so as to benefit reducing a shrinkage difference between the wide molding portion 220 and the narrow molding portion 210. In some embodiments, the compensating structure 300 may be a protrusion that protrudes from the narrow molding portion 210, which may benefit to alleviate the asymmetric warpage due to the shrinkage difference between the narrow molding portion 210 and the wide molding portion 220.

Figure 14:
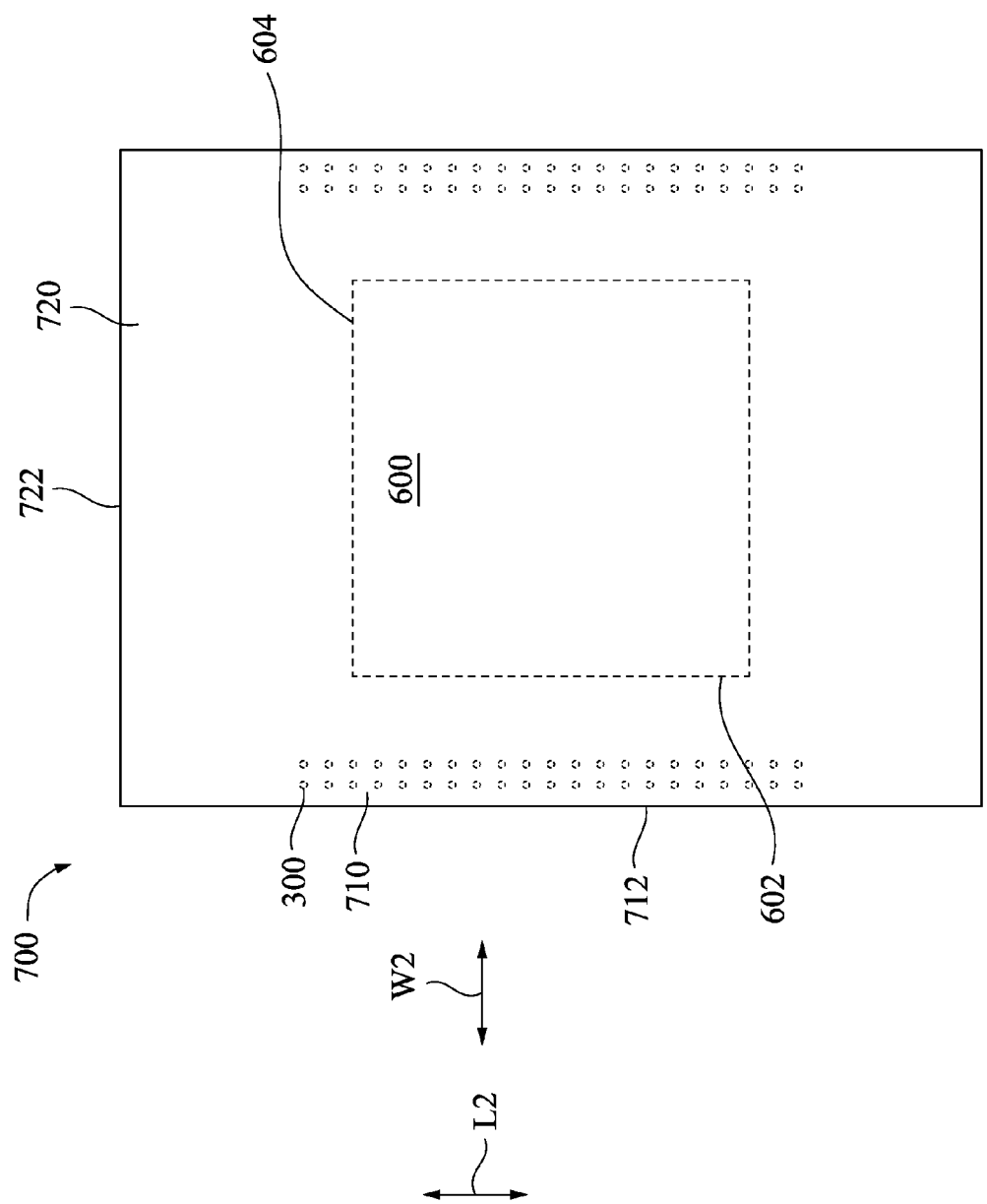

As shown in FIG. 14, which is a top view of the structure shown in FIG. 13, the second molding compound 700 includes at least one narrow molding portion 710 and at least one wide molding portion 720. The narrow molding portion 710 is present on a first sidewall 602 of the second semiconductor device 600, and the wide molding portion 720 is present on a second sidewall 604 of the second semiconductor device 600. The narrow molding portion 710 is narrower than the wide molding portion 720. In other words, the narrow molding portion 710 and the wide molding portion 720 respectively include peripheries 712 and 722 that are distal to the second semiconductor device 600, and a distance from the periphery 712 of the narrow molding portion 710 to the first sidewall 602 is less than a distance from the periphery 722 of the wide molding portion 720 to the second sidewall 604. As such, the narrow molding portion 710 is narrower than the wide molding portion 720.

As shown in FIG. 14, volume of the narrow molding portion 710 is less than volume of the wide molding portion 720 because the narrow molding portion 210 is narrower than the wide molding portion 220. Therefore, shrinkage of the narrow molding portion 710 during formation of the second molding compound 700 may be less than that of the wide molding portion 720, thereby causing asymmetric warpage to the semiconductor package. In some embodiments, the compensating structure 300 is connected to the narrow molding portion 710, and the compensating structure 300 and the narrow molding portion 710 are made of the same second molding compound 700. Therefore, during the formation of the second molding compound 700, the compensating structure 300 monolithically connected to the narrow molding portion 710 can increase shrinkage in a direction or directions in which the narrow molding portion 710 shrinks, thereby alleviating the asymmetric warpage of the semiconductor package.

In some embodiments, the compensating structure 300 is absent on the wide molding portion 720. In other words, the compensating structure 300 present on the narrow molding portion 710 does not extend to the wide molding portion 720. Therefore, the compensating structure 300 does not increase shrinkage in a direction or directions in which the wide molding portion 720 shrinks, so as to benefit reducing a shrinkage difference between the wide molding portion 720 and the narrow molding portion 710. In some embodiments, the compensating structure 300 may be a protrusion that protrudes from the narrow molding portion 710, which may benefit to alleviate the asymmetric warpage due to the shrinkage difference between the narrow molding portion 710 and the wide molding portion 720.

In some embodiments, the second molding compound 700 and the compensating structure 300 may be made of a polymer-based material. The term "polymer" can represent thermosetting polymers, thermoplastic polymers, or any mixtures thereof. The polymer-based material can include, for example, plastic materials, epoxy resin, polyimide, polyethylene terephthalate (PET), polyvinyl chloride (PVC), polymethylmethacrylate (PMMA), polymer components doped with specific fillers including fiber, clay, ceramic, inorganic particles, or any combinations thereof. In other embodiments, the second molding compound 700 and the compensating structure 300 may be made of epoxy resin, such as epoxy cresol novolac (ECN), biphenyl epoxy resin, multifunctional liquid epoxy resin, or any combinations thereof. In still other embodiments, the second molding compound 700 and the compensating structure 300 may be made of epoxy resin optionally including one or more fillers to provide the composition with any of a variety of desirable properties. Examples of fillers can be aluminum, titanium dioxide, carbon black, calcium carbonate, kaolin clay, mica, silica, talc, wood flour, or any combinations thereof. In some embodiments, the second molding compound 700 and the compensating structure 300 are made of a material different from that of the first dielectric layer 400.

In some embodiments, the compensating structure 300, the first molding compound 200 (including the narrow molding portion 210 and the wide molding portion 220), and the second molding compound 700 (including the narrow molding portion 710 and the wide molding portion 720) are made of substantially the same material. Therefore, after the formation of the second molding compound 700, the compensating structure 300 is monolithically connected to the narrow molding portion 210 of the first molding compound 200. In other words, the compensating structure 300 monolithically connects the narrow molding portion 210 of the first molding compound 200 and the narrow molding portion 710 of the second molding compound 700.

In some embodiments, the recessed feature R may be formed as a circular through hole, and the compensating structure 300 may be formed as a round pillar that conformal fits with the circular through hole. In some embodiments, a plurality of the compensating structures 300 are present in the first dielectric layer 400 and on opposite sides of the second semiconductor device 600. In particular, the second semiconductor device 600 is present between a plurality of the narrow molding portions 710, and the compensating structures 300 are respectively present on the narrow molding portions 710. In some embodiments, a plurality of the compensating structures 300 may be arranged substantially along a lengthwise direction L2 of the narrow molding portion 710. In some embodiments, a plurality of the compensating structures 300 may be arranged substantially along a widthwise direction W2 of the narrow molding portion 710. In some other embodiments, the compensating structures 300 may be arranged in a grid pattern of rows and columns.

Figure 15:
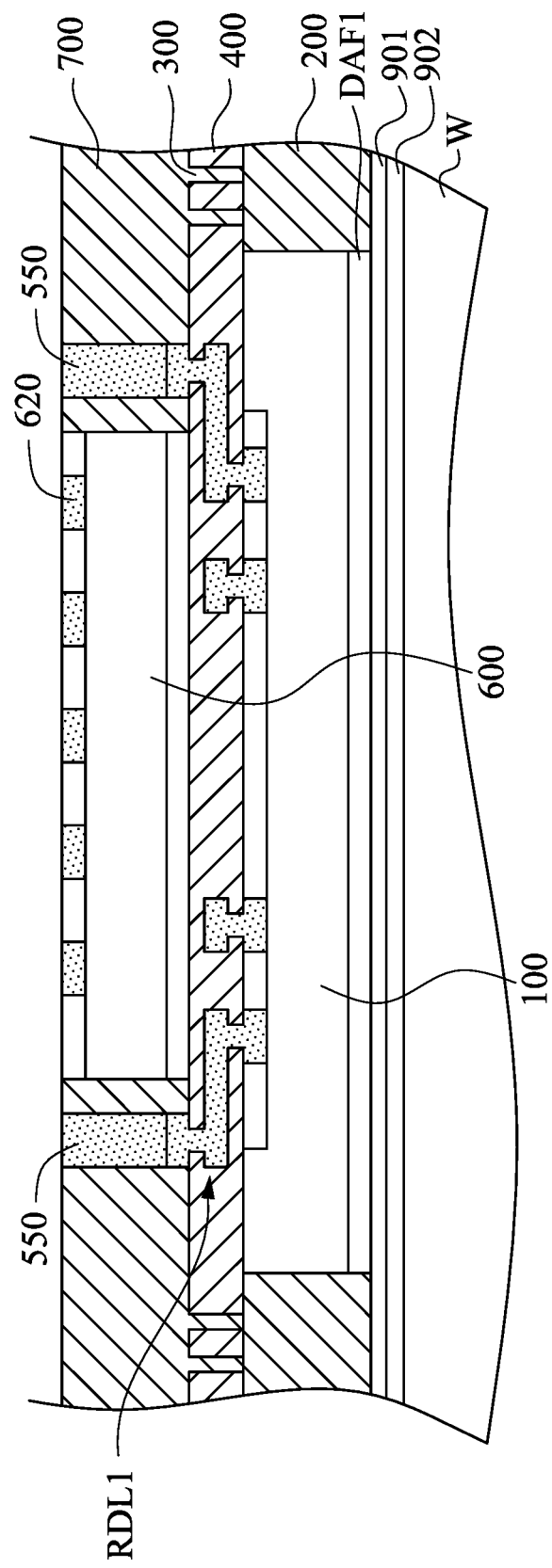

In FIG. 15, a portion of the second molding compound 700 overlying the second semiconductor device 600 is removed so that contact pads 620 on the top side of the second semiconductor device 600 and the TIVs 550 are exposed. Removal of the portion of the second molding compound 700 may be performed by a grinding process or a CMP process.

Figure 16:
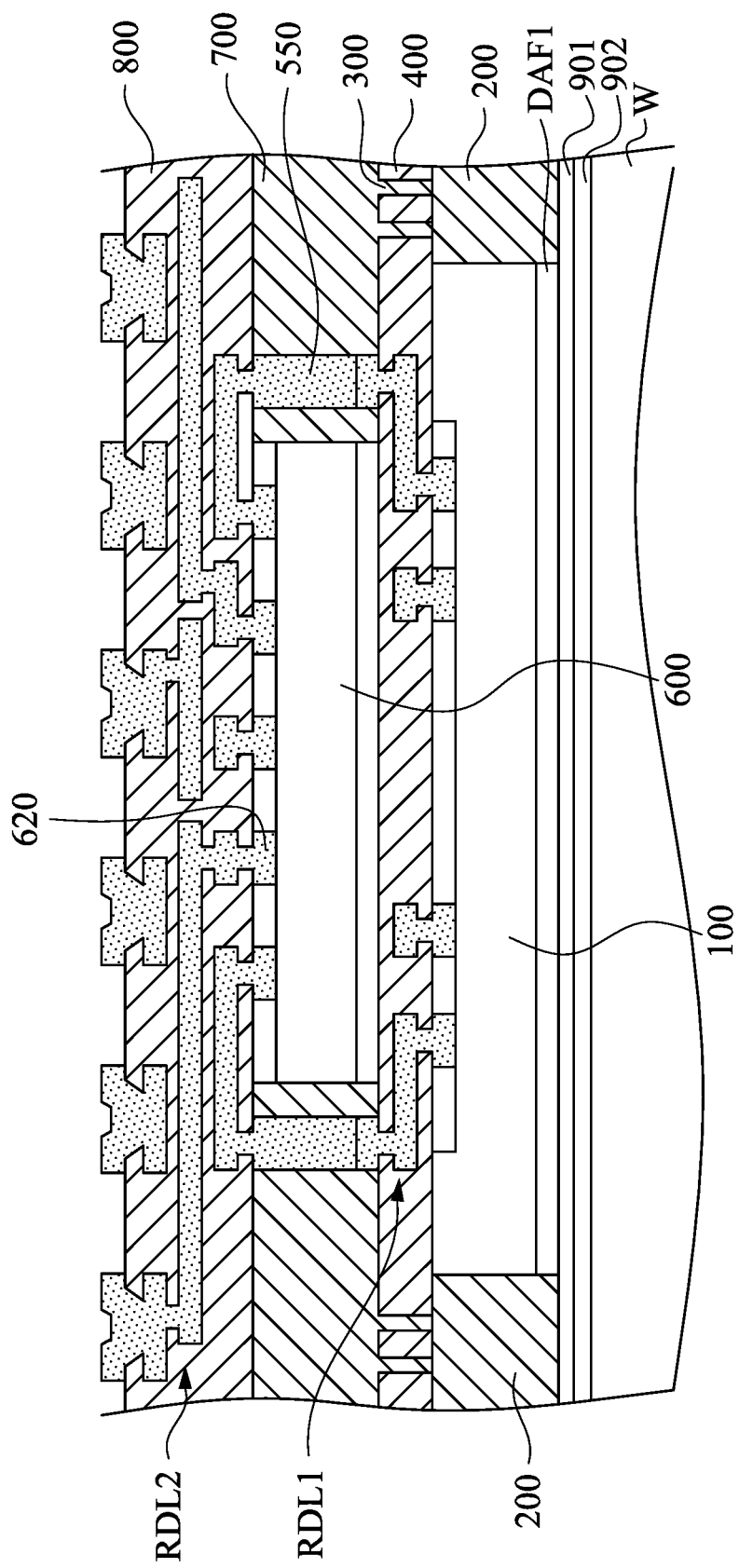

In FIG. 16, a second dielectric layer 800 is formed on the second semiconductor device 600 and the second molding compound 700. A conductive feature, such as a second redistribution layer RDL2, is formed in the second dielectric layer 800 to electrically connect to the contact pads 620 of the second semiconductor device 600 and the TIVs 550 in the second molding compound 700. In some embodiments, the second dielectric layer 800 may include at least one dielectric material, such as silicon oxide, silicon nitride, silicon oxynitride, low-k dielectric material, ultra low-k dielectric material, one or more dielectric materials, or any combinations thereof. In some embodiments, the second redistribution layer RDL2 may include via plugs, contact plugs, damascene structures, dual damascene structures, metallic regions, metallic lines, or any combinations thereof. The via plugs, contact plugs, damascene structures, dual damascene structures, metallic regions, and metallic lines may be made of at least one conductive material, such as tungsten, aluminum, copper, titanium, tantalum, titanium nitride, tantalum nitride, nickel silicide, cobalt silicide, other proper conductive materials, or combinations thereof. In some embodiments, there are multiple second dielectric layers 800 and multiple second redistribution layers RDL2. Each second redistribution layer RDL2 can be sandwiched by two of the second dielectric layers 800.

Figure 17:
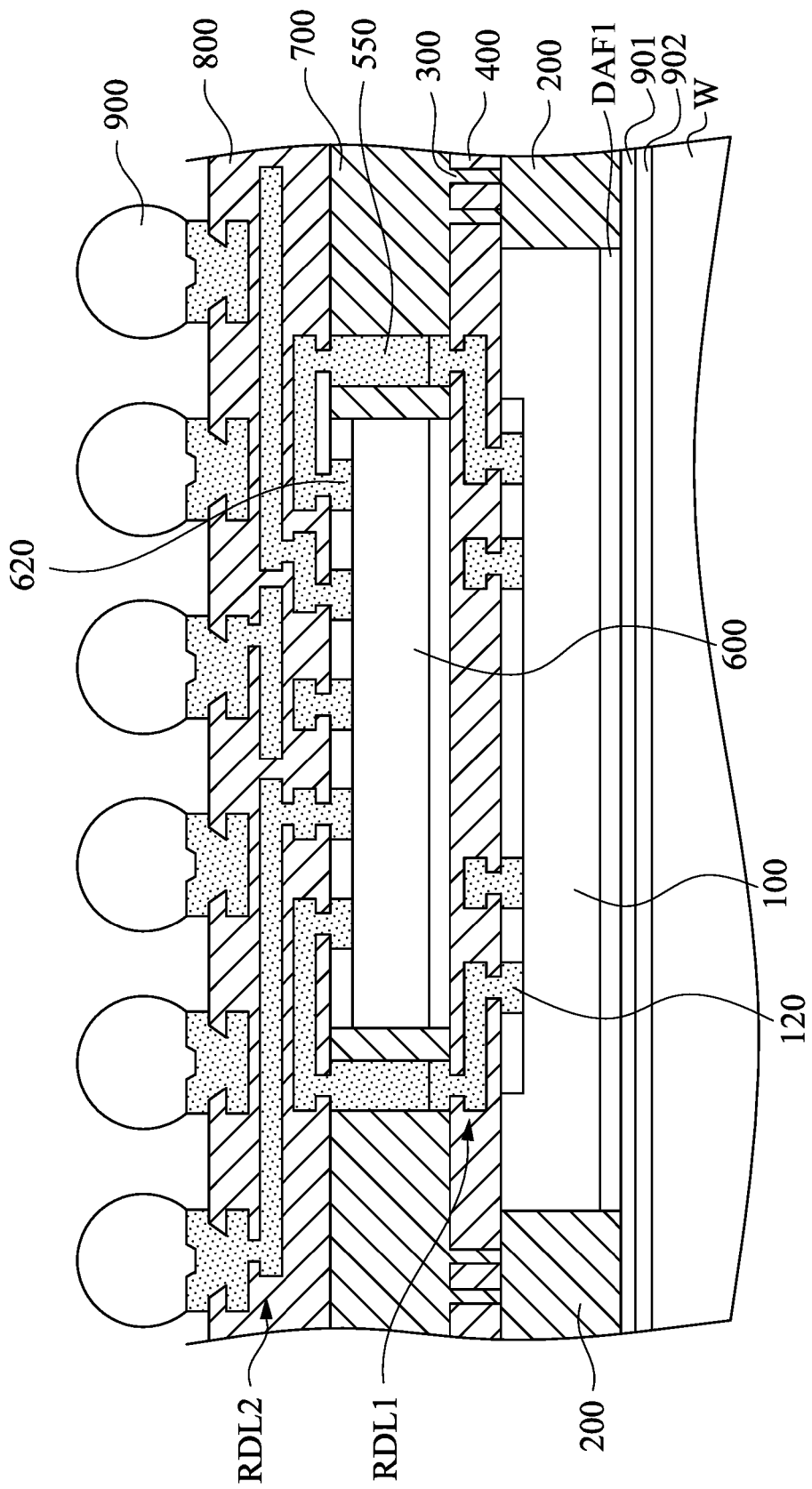
Figure 18:
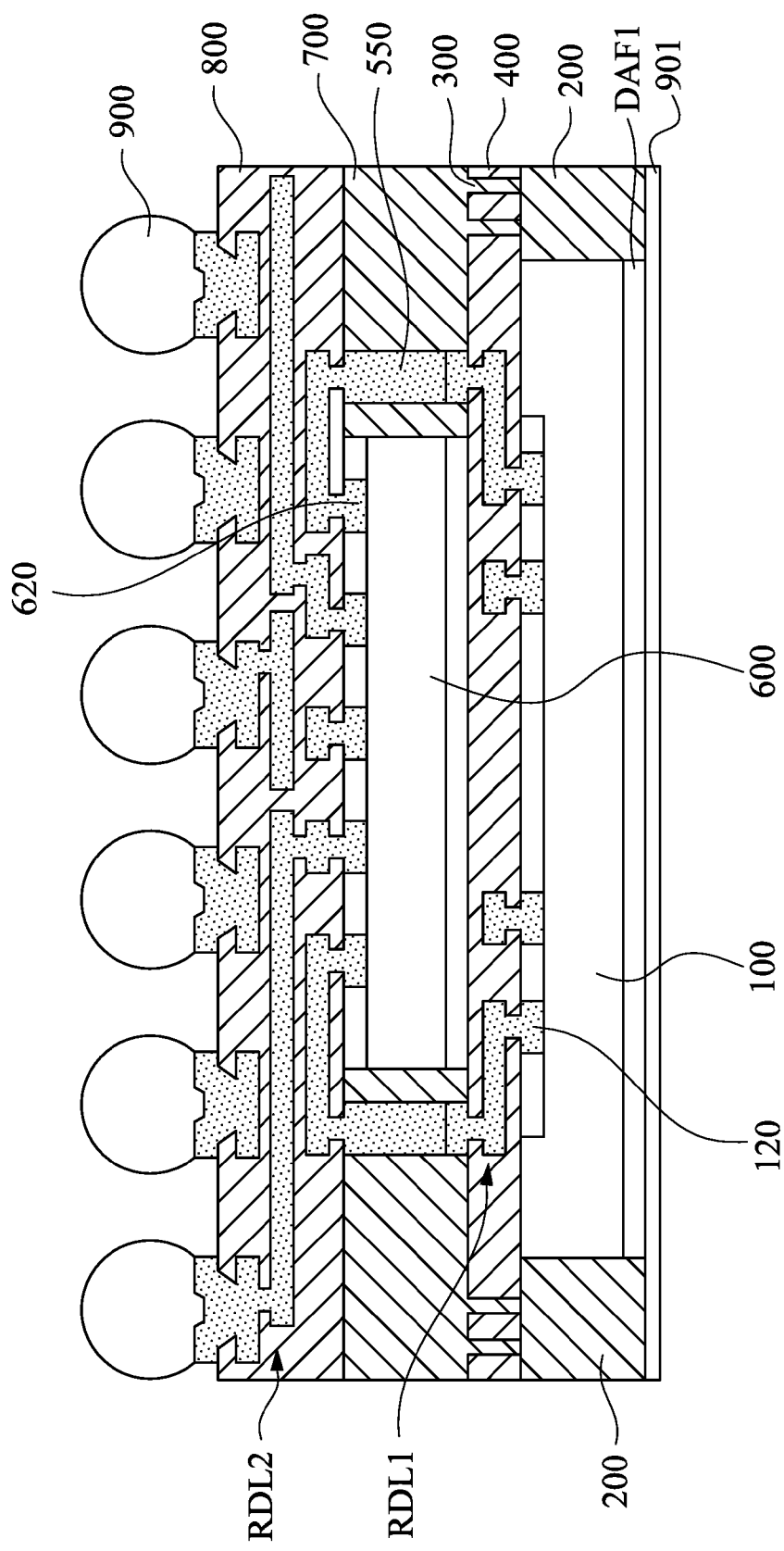

Thereafter, as shown in FIG. 17, a plurality of external connectors 900 are respectively formed on pads (not labeled) of the second redistribution layer RDL2 exposed on a top side of the second dielectric layer 800, so that the external connectors 900 are electrically connected to the second redistribution layer RDL2. The external connectors 900 can each include, for example, as a lead-free alloy (e.g., gold (Au), a tin/silver/copper (Sn/Ag/Cu) alloy, or other lead-free alloys), a lead-containing alloy (e.g., a lead/tin (Pb/Sn) alloy), copper, aluminum, aluminum copper, conductive polymer, other bump metal materials, or any combinations thereof. In some other embodiments, the external connectors 900 may be solder connectors such as solder balls. These solder balls may be arranged in a grid pattern of rows and columns. The external connectors 900 may thus form a ball grid array (BGA). By using the redistribution layers RDL1 and RDL2, the pitch of contact pads 120 of the first semiconductor device 100 can be fanned out to the pitch of the external connectors 900. Similarly, by using the second redistribution layer RDL2, the pitch of contact pads 620 of the second semiconductor device 600 can be fanned out to the pitch of the external connectors 900. Afterwards, the semiconductor package may be de-bonded from the carrier wafer W, and the adhesive layer 902 is also cleaned from the semiconductor package, and then, the semiconductor package may be sawed into a plurality of packages. The resulting structure is shown in FIG. 18.

Figure 19:
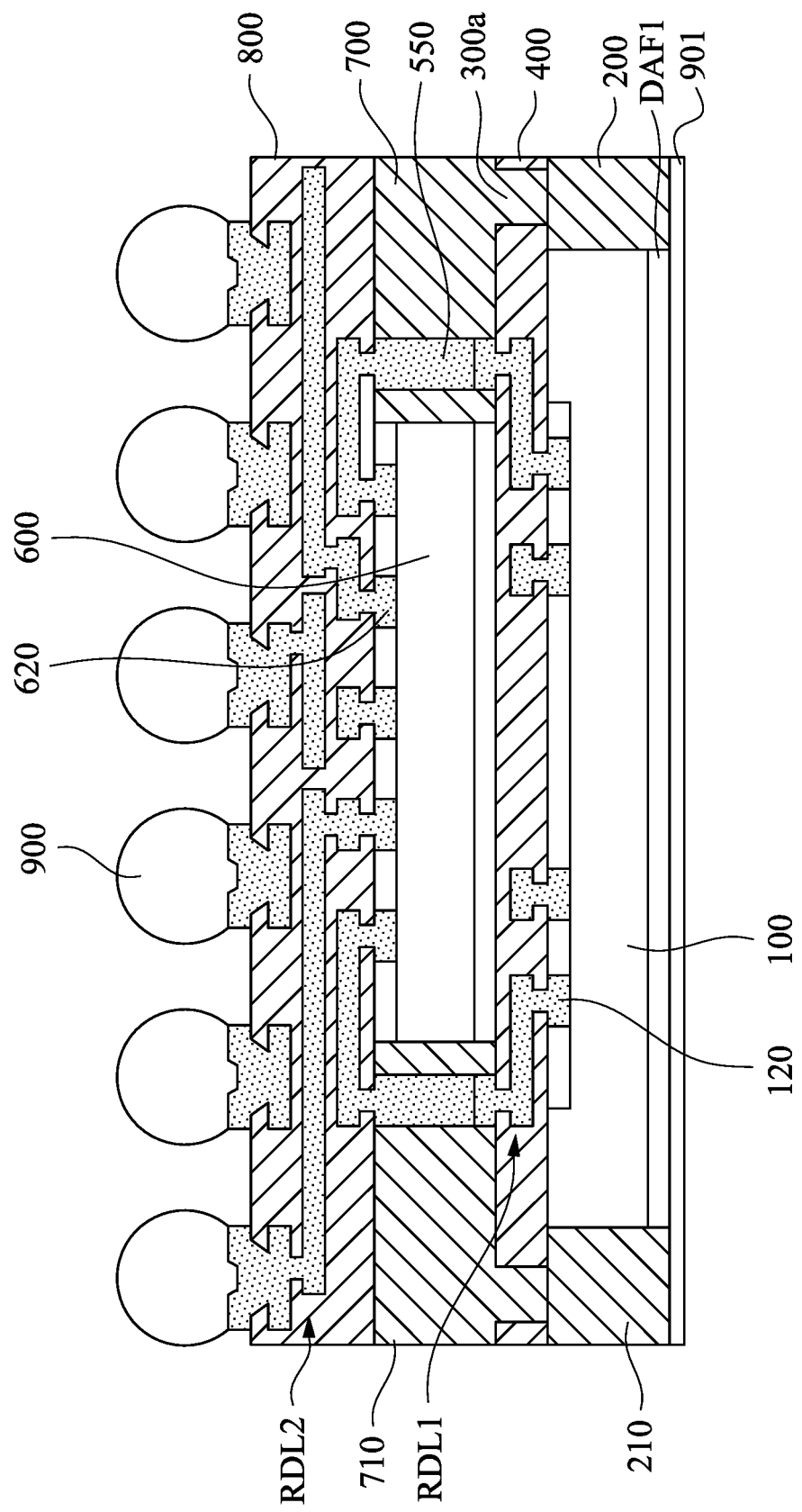
FIG. 19 is a cross-sectional view of a semiconductor package in accordance with some embodiments of the present disclosure.
Figure 20:
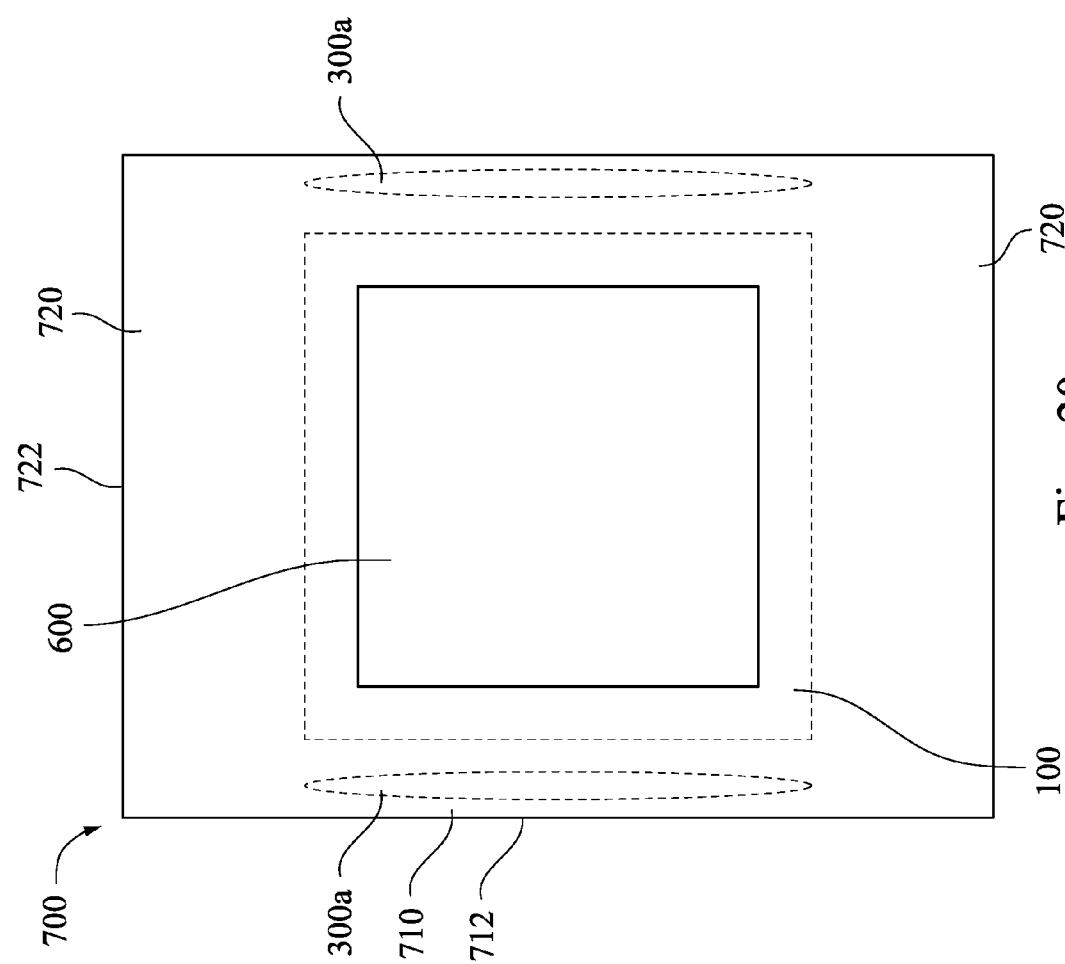
FIG. 20 is a top view of the semiconductor package shown in FIG. 19, in which the dielectric layer, the redistribution layer and the external connectors over the upper semiconductor device are not shown.

FIG. 19 is a cross-sectional view of a semiconductor package in accordance with some embodiments of the present disclosure. FIG. 20 is a top view of the semiconductor package shown in FIG. 19, in which the second dielectric layer 800, the second redistribution layer RDL2 and the external connectors 900 are not shown. As shown in FIG. 19 and FIG. 20, the compensating structure 300a is formed as an elliptical cylinder, not as a round pillar. The elliptically cylindrical structure 300a monolithically connects the narrow molding portion 210 of the first molding compound 200 and the narrow molding portion 710 of the second molding compound 700. Therefore, the elliptically cylindrical structure 300a can alleviate the asymmetric warpage of the semiconductor package. Other features of the elliptically cylindrical structure 300a are similar to the foregoing compensating structure 300 and therefore are not described repeatedly.

Figure 21:
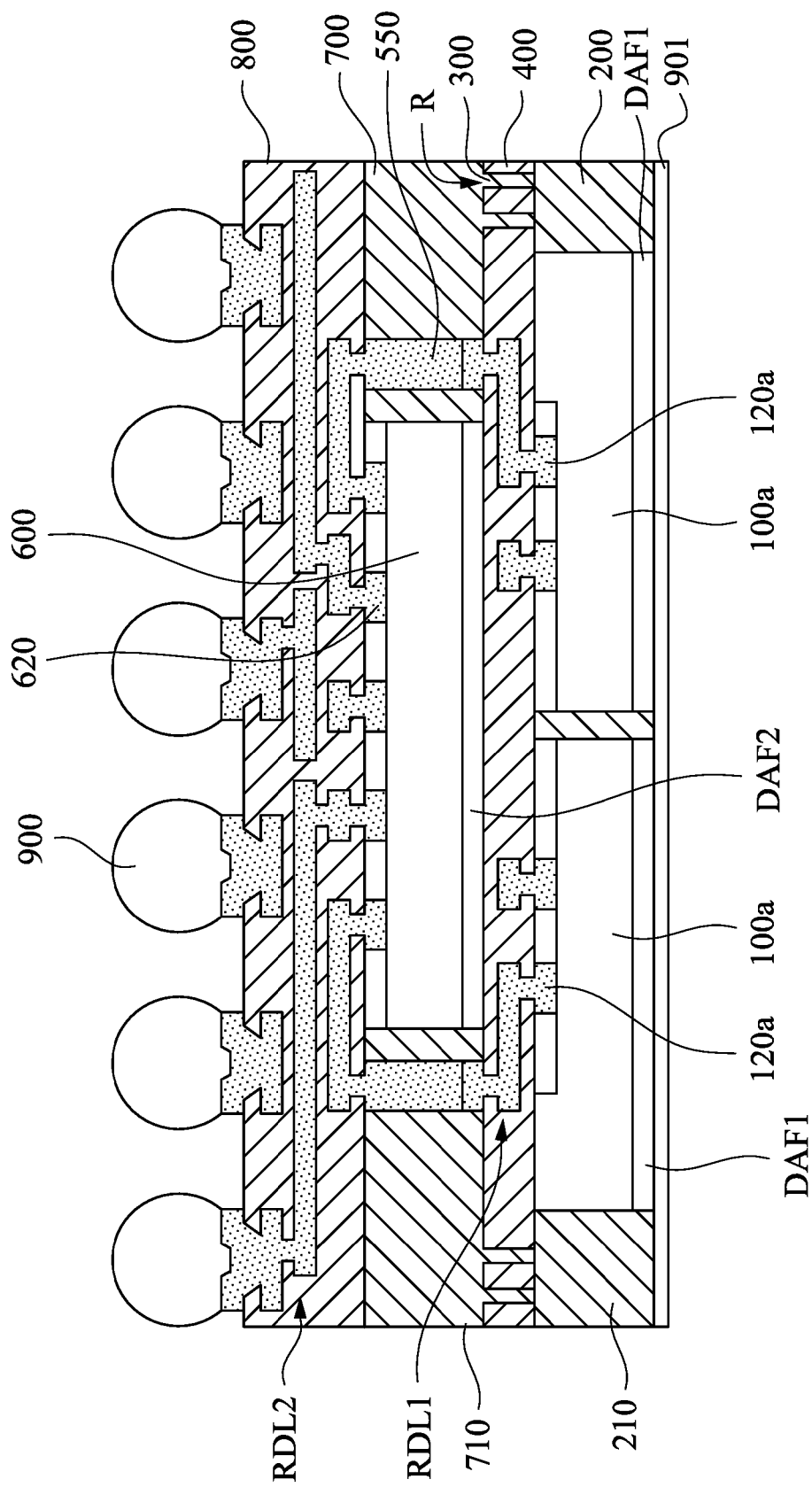
FIG. 21 is a cross-sectional view of a semiconductor package in accordance with some embodiments of the present disclosure.
Figure 22:
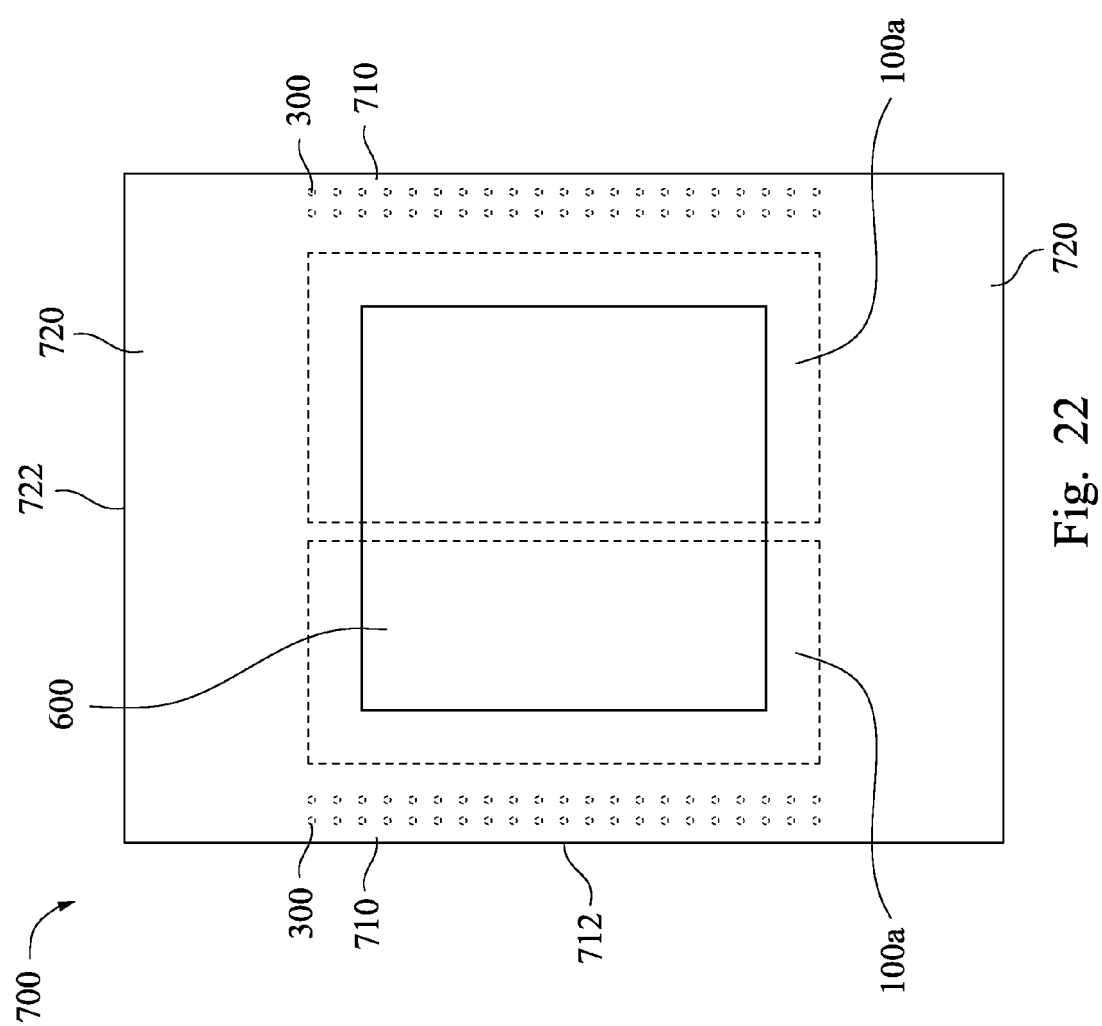
FIG. 22 is a top view of the semiconductor package shown in FIG. 21, in which the dielectric layer, the redistribution layer and the external connectors over the upper semiconductor device are not shown.

FIG. 21 is a cross-sectional view of a semiconductor package in accordance with some embodiments of the present disclosure. FIG. 22 is a top view of the semiconductor package shown in FIG. 21, in which the second dielectric layer 800, the second redistribution layer RDL2 and the external connectors 900 are not shown. As shown in FIGS. 21-22, a plurality of the first semiconductor devices 100a are horizontally separated. The first semiconductor devices 100a may have the same or different sizes. The first semiconductor devices 100a may increase a volume difference between the narrow and wide molding portions of the first molding compound 200, and such a volume difference may increase a shrinkage difference between the narrow and wide molding portions, which may increase asymmetric warpage of the first molding compound 200. The compensating structure 300 monolithically connected the narrow molding portion 210 can reduce the asymmetric warpage of the semiconductor package because the compensating structure 300 can increase the shrinkage in the direction or directions in which the narrow molding portion 210 shrinks. Similar to the foregoing first semiconductor device 100, the first semiconductor devices 100a each may be a die having a conductive layer formed as a contact pad 120a on the top surface of the first semiconductor device 100a using a patterning and deposition process. Semiconductor devices 100a may each have a plurality of contact pads 120a. The exemplary detailed features of the contact pad 120a are similar to the foregoing contact pad 120, and they are therefore not described repeatedly.

Figure 23:
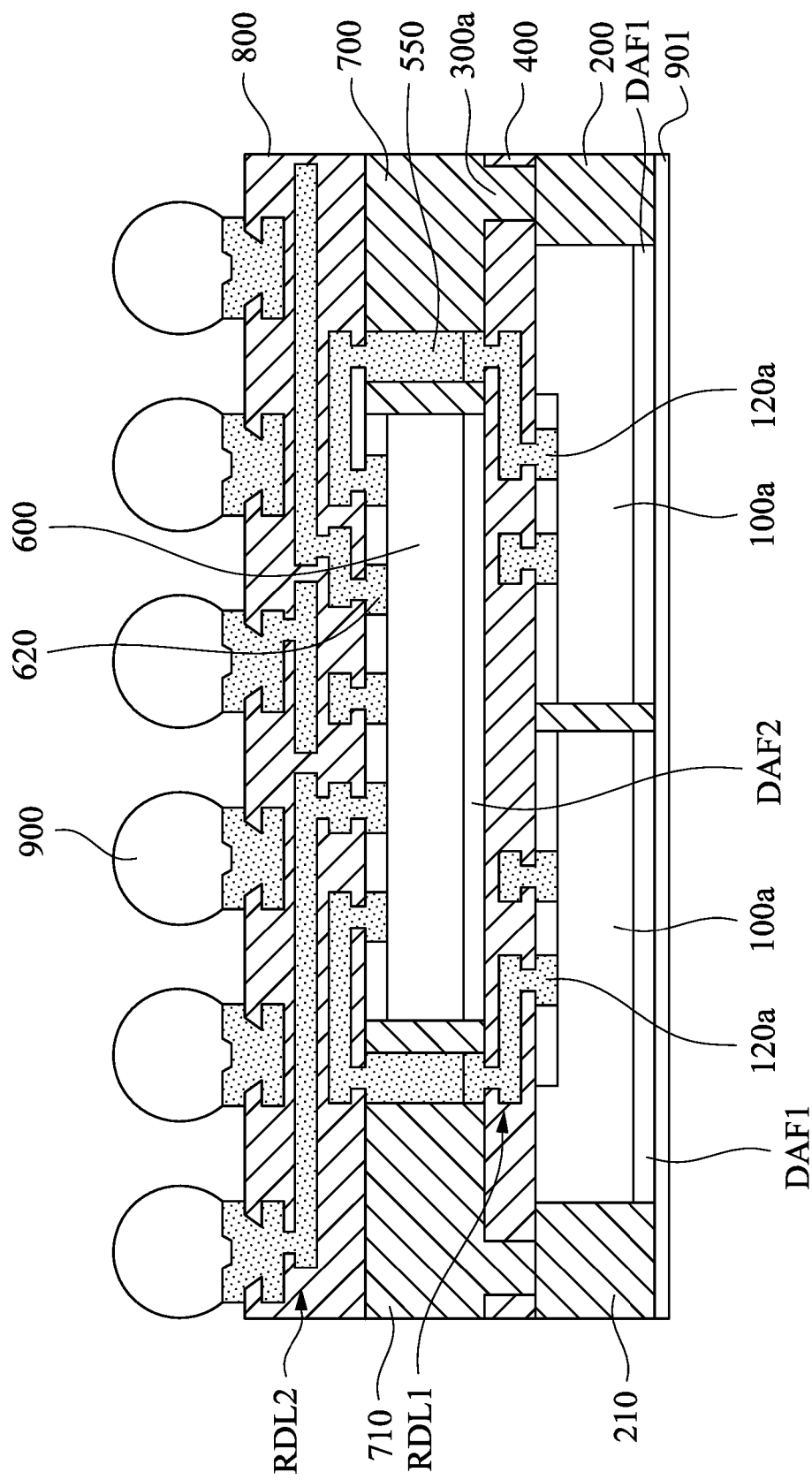
FIG. 23 is a cross-sectional view of a semiconductor package in accordance with some embodiments of the present disclosure.
Figure 24:
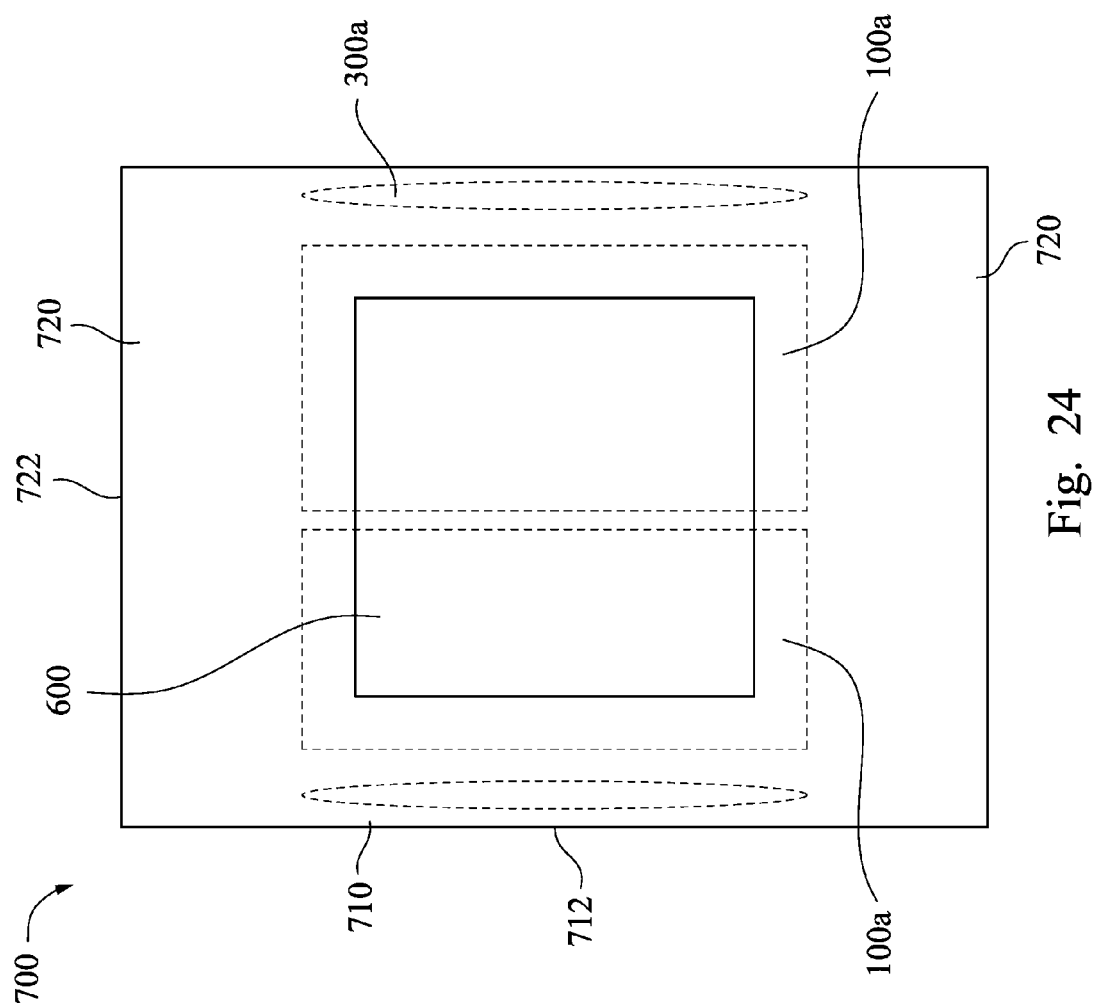
FIG. 24 is a top view of the semiconductor package shown in FIG. 23, in which the dielectric layer, the redistribution layer and the external connectors over the upper semiconductor device are not shown.

FIG. 23 is a cross-sectional view of a semiconductor package in accordance with some embodiments of the present disclosure. FIG. 24 is a top view of the semiconductor package shown in FIG. 23, in which the second dielectric layer 800, the second redistribution layer RDL2 and the external connectors 900 are not shown. As shown in FIG. 23 and FIG. 24, the compensating structure 300a is formed as an elliptical cylinder, not as a round pillar. The elliptically cylindrical structure 300a monolithically connects the narrow molding portions 210 and 710. Therefore, the elliptically cylindrical structure 300a can alleviate the asymmetric warpage of the semiconductor package that includes plural first semiconductor devices 100a horizontally arranged in the first molding compound 200. Other features of the elliptically cylindrical structure 300a are similar to the foregoing compensating structure 300 and therefore are not described repeatedly.

Since the compensating structure in the dielectric layer can increase shrinkage in a direction or directions, a shrinkage difference between different portions of the molding compound can be reduced, thereby alleviating asymmetric warpage caused by the shrinkage difference between different portions of the molding compound. In some embodiments, the compensating structure is present on the narrow molding portion of the molding compound to increase shrinkage in a direction or directions in which the narrow molding portion of the molding compound shrinks, so that asymmetric warpage caused by a shrinkage difference between the narrow and wide molding portions of the molding compound can be alleviated.

According to some embodiments, a semiconductor package includes at least one first semiconductor device, a first molding compound, a dielectric layer, at least one conductive feature and at least one compensating structure. The first molding compound is present on at least one sidewall of the first semiconductor device. The dielectric layer is present on the first molding compound and the first semiconductor device. The conductive feature present is at least partially in the dielectric layer and electrically connected to the first semiconductor device. The compensating structure is present at least partially in the dielectric layer. The compensating structure is monolithically connected to the first molding compound.

According to some embodiments, a semiconductor package includes at least one semiconductor device, at least one narrow molding portion, at least one wide molding portion and at least one compensating structure. The semiconductor device has a first sidewall and a second sidewall adjacent to each other. The narrow molding portion is present on the first sidewall of the semiconductor device. The wide molding portion is present on the second sidewall of the semiconductor device. The narrow molding portion is narrower than the wide molding portion. The compensating structure is present on the narrow molding portion. The compensating structure and the narrow molding portion are made of substantially the same material.

According to some embodiments, a method of forming a semiconductor package includes forming a first molding compound on at least one sidewall of at least one first semiconductor device, forming at least one dielectric layer on the first molding compound and the first semiconductor device, forming at least one recessed feature in the dielectric layer, disposing at least one second semiconductor device on the dielectric layer and forming a second molding compound on at least one sidewall of the second semiconductor device, in which at least a part of the second molding compound is formed in the recessed feature after the forming the second molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   at least one first semiconductor device;
   a first molding compound present on at least one sidewall of the first semiconductor device;
   a dielectric layer present on the first molding compound and the first semiconductor device;
   at least one conductive feature present at least partially in the dielectric layer and electrically connected to the first semiconductor device; and
   at least one compensating structure through a recessed feature in the dielectric layer, wherein the compensating structure is monolithically connected to the first molding compound.

2. The semiconductor package of claim 1, wherein the first molding compound has a first portion on a first sidewall of the first semiconductor device and a second portion on a second sidewall of the first semiconductor device, the first portion is narrower than the second portion, and the compensating structure is monolithically connected to the first portion.

3. The semiconductor package of claim 1, wherein the first molding compound has a first portion on a first sidewall of the first semiconductor device and a second portion on a second sidewall of the first semiconductor device, the first portion is narrower than the second portion, and the compensating structure is absent on the second portion.

4. The semiconductor package of claim 1, wherein the compensating structure and the first molding compound are made of substantially the same material.

5. The semiconductor package of claim 1, further comprising:
    a second semiconductor device present on the dielectric layer; and
    a second molding compound present on at least one sidewall of the second semiconductor device.

6. The semiconductor package of claim 1, wherein a plurality of the first semiconductor devices are encircled by the first molding compound.

7. The semiconductor package of claim 1, wherein a plurality of the compensating structures are present in the dielectric layer.

8. The semiconductor package of claim 5, wherein the compensating structure is monolithically connected to the second molding compound.

9. The semiconductor package of claim 5, wherein the second molding compound has a first portion on a first sidewall of the second semiconductor device and a second portion on a second sidewall of the second semiconductor device, the first portion is narrower than the second portion, and the compensating structure is monolithically connected to the first portion.

10. The semiconductor package of claim 5, wherein the second molding compound has a first portion on a first sidewall of the second semiconductor device and a second portion on a second sidewall of the second semiconductor device, the first portion is narrower than the second portion, and the compensating structure is absent on the second portion.

11. The semiconductor package of claim 5, wherein the compensating structure and the second molding compound are made of substantially the same material.

12. The semiconductor package of claim 6, wherein the first semiconductor devices have different sizes.

13. A semiconductor package, comprising:
    at least one semiconductor device has a first sidewall and a second sidewall adjacent to each other;
    at least one narrow molding portion present on the first sidewall of the semiconductor device;
    at least one wide molding portion present on the second sidewall of the semiconductor device, the narrow molding portion being narrower than the wide molding portion;
    at least one compensating structure present on the narrow molding portion, wherein the compensating structure and the narrow molding portion are made of substantially the same material; and
    a dielectric layer over the narrow molding portion, wherein the compensating structure extends from the narrow molding portion through a recessed feature in the dielectric layer.

14. The semiconductor package of claim 13, wherein the compensating structure is monolithically connected to the narrow molding portion.

15. The semiconductor package of claim 13, further comprising:
    a molding compound; and
    a dielectric layer present between the narrow molding portion and the molding compound,
    wherein the compensating structure monolithically connects the narrow molding portion and the molding compound through the dielectric layer.

16. The semiconductor package of claim 15, wherein the dielectric layer and the narrow molding portion are made of different materials.

17. The semiconductor package of claim 15, wherein the molding compound has a first portion on a first sidewall of a second semiconductor device and a second portion on a second sidewall of the second semiconductor device, the first portion is narrower than the second portion, and the compensating structure monolithically connects the first portion and the narrow molding portion.

18. A method of forming a semiconductor package, comprising:
    providing a first molding compound on at least one sidewall of at least one first semiconductor device;
    forming at least one dielectric layer on the first molding compound and the first semiconductor device;
    forming at least one recessed feature in the dielectric layer;
    disposing at least one second semiconductor device on the dielectric layer; and
    providing a second molding compound on at least one sidewall of the second semiconductor device, wherein at least a part of the second molding compound is formed in the recessed feature after forming the second molding compound.

19. The method of claim 18, further comprising:
    forming at least one conductive feature in the dielectric layer and electrically connected to the first semiconductor device.

20. The method of claim 18, wherein the forming the recessed feature comprises:
    forming at least one through hole in the dielectric layer.

* * * * *